US012354618B2

(12) United States Patent
Shidoji et al.

(10) Patent No.: US 12,354,618 B2
(45) Date of Patent: Jul. 8, 2025

(54) CONTROL METHOD, CONTROL DEVICE, AND STORAGE MEDIUM

(71) Applicant: Yamaha Corporation, Shizuoka (JP)

(72) Inventors: Hiroomi Shidoji, Shizuoka (JP); Kenichi Tamiya, Shizuoka (JP)

(73) Assignee: Yamaha Corporation, Shizuoka (JP)

( * ) Notice: Subject to any disclaimer, the term of this patent is extended or adjusted under 35 U.S.C. 154(b) by 251 days.

(21) Appl. No.: 17/952,061

(22) Filed: Sep. 23, 2022

(65) Prior Publication Data

US 2023/0019272 A1 Jan. 19, 2023

Related U.S. Application Data

(63) Continuation of application No. PCT/JP2021/012349, filed on Mar. 24, 2021.

(30) Foreign Application Priority Data

Mar. 25, 2020 (JP) ................................ 2020-053770

(51) Int. Cl.
*G10L 21/0232* (2013.01)
*G03G 5/16* (2006.01)
(Continued)

(52) U.S. Cl.
CPC ......... *G10L 21/0232* (2013.01); *H03G 5/165* (2013.01); *H03H 17/02* (2013.01);
(Continued)

(58) Field of Classification Search
CPC . G10L 21/0232; G10L 21/0316; H03G 5/165; H03H 17/02; H04R 3/00; H04R 3/04
(Continued)

(56) References Cited

U.S. PATENT DOCUMENTS

2010/0239107 A1\* 9/2010 Fujita ..................... H04H 60/04
381/119
2017/0373656 A1\* 12/2017 Bharitkar ................. H04R 3/04
(Continued)

FOREIGN PATENT DOCUMENTS

JP 2009081660 A \* 4/2009
JP 2013110568 A 6/2013
(Continued)

OTHER PUBLICATIONS

International Search Report in PCT/JP2021/012349 dated May 25, 2021.
(Continued)

*Primary Examiner* — Edwin S Leland, III
(74) *Attorney, Agent, or Firm* — Global IP Counselors, LLP (57) ABSTRACT

A method for controlling a frequency response having a bell-shaped amplitude characteristic of a filter that is configured to process an audio signal includes preparing a high-frequency parameter related to a high-frequency side characteristic on a high-frequency side of the frequency response, and a low-frequency parameter related to a low-frequency side characteristic on a low-frequency side of the frequency response, independently changing the high-frequency parameter or the low-frequency parameter in accordance with a first change instruction, changing both of the high-frequency parameter and the low-frequency parameter in conjunction with each other in accordance with a second change instruction, and controlling a slope on the high-frequency side and a slope on the low-frequency side of the bell-shaped amplitude characteristic of the frequency response, by using the high-frequency parameter and the low-frequency parameter.

11 Claims, 7 Drawing Sheets

(51) Int. Cl.
    *H03G 5/16*     (2006.01)
    *H03H 17/02*     (2006.01)
    *H04R 3/00*     (2006.01)
    *H04R 3/04*     (2006.01)
    *G10L 21/0316*     (2013.01)

(52) U.S. Cl.
    CPC ................ *H04R 3/00* (2013.01); *H04R 3/04* (2013.01); *G10L 21/0316* (2013.01)

(58) Field of Classification Search
    USPC ........................................................ 704/226
    See application file for complete search history.

(56) References Cited

U.S. PATENT DOCUMENTS

| | | | |
|---|---|---|---|
| 2021/0014609 A1* | 1/2021 | Ishizuka | H04R 3/04 |
| 2023/0019272 A1* | 1/2023 | Shidoji | H04R 3/00 |

FOREIGN PATENT DOCUMENTS

| | | | | |
|---|---|---|---|---|
| JP | 2017022537 A | | 1/2017 | |
| JP | 20191699847 | * | 10/2019 | |
| JP | 7017103 B2 | * | 2/2022 | ............. H03H 17/02 |

OTHER PUBLICATIONS

Notice of Reasons for Refusal in the corresponding Japanese Patent Application No. 2020-053770, dated Jun. 24, 2024.
Notice of Reasons for Refusal in the corresponding Japanese Patent Application No. 2020-053770, dated Mar. 11, 2024.

* cited by examiner

CONTROL METHOD, CONTROL DEVICE, AND STORAGE MEDIUM

CROSS-REFERENCE TO RELATED APPLICATIONS

This application is a continuation application of International Application No. PCT/JP2021/012349, filed on Mar. 24, 2021, which claims priority to Japanese Patent Application No. 2020-053770 filed in Japan on Mar. 25, 2020. The entire disclosures of International Application No. PCT/JP2021/012349 and Japanese Patent Application No. 2020-053770 are hereby incorporated herein by reference.

BACKGROUND

Technological Field

The present disclosure relates to a control method, a control device, and a storage medium.

Background Information

A technology for controlling the frequency response of a filter to which an audio signal has been input is known from the prior art. The frequency response is a characteristic of the filter in the frequency domain and is specified by the amplitude and phase characteristics. Each peaking filter of a graphic equalizer (GEQ) or a parametric equalizer (PEQ) typically consists of a Biquad filter. The transmission characteristics of a Biquad filter-based peaking filter are essentially the same for both analog and digital implementations. Since they have used peaking filters that have approximately the same amplitude characteristics, users are accustomed to the sound quality based on these amplitude characteristics.

US Patent Application Publication No. 2021/014609 discloses a peaking filter realized as an FIR (Finite Impulse Response) filter in which the bandwidths of the inclined portions on the high-frequency side and the low-frequency side of the frequency response of one peaking filter are controlled independently of each other, so that an asymmetrically shaped amplitude characteristic is obtained.

On the other hand, conventional peaking filters, whether analog or digital, are often operated by three parameters: the center frequency, gain, and Q value (sharpness). Analog and digital peaking filters consist of Biquad filters with similar algorithms and have similar amplitude characteristics (sound quality). That is, digital Biquad filters are usually IIR (Infinite Impulse Response) filters. Wikipedia "Digital biquad filter" (URL:https://en.wikipedia.org/wiki/Digital_biquad_filter) and Wikipedia "Q factor" (URL: https://en.wikipedia.org/wiki/Q_factor) provide a basic explanation of Biquad filters and Q factor.

SUMMARY

Since conventional peaking filters, whether analog or digital, have essentially the same amplitude characteristics and the same operability (specification of center frequency, gain, and Q value), users are often accustomed to them. If the user can be made to feel as if some functions have been added to the peaking filter with which the user is familiar, convenience of use can be improved without burdening the user.

However, in the technology of a peaking filter consisting of an FIR filter disclosed in US Patent Application Publication No. 2021/014609, the user specifies the bandwidths of the inclined portions, and the operability and amplitude characteristics of a Biquad filter cannot be obtained. On the other hand, although users are accustomed to the operability and sound quality of peaking filters that consist of a conventional analog or digital Biquad filters, the aforementioned three parameters do not provide an amplitude characteristic with an asymmetric shape. Moreover, it is difficult to make the amplitude characteristic asymmetric by adding some parameters to this filter due to the algorithmic constraints inherent to Biquad filters.

In view of the problems described above, an object of the present disclosure is to provide a peaking filter that can realize an asymmetrically shaped amplitude characteristic while maintaining the same operability and amplitude characteristic of a conventional Biquad filter.

In order to solve the problem described above, the control method according to the present disclosure is a method for controlling the frequency response having a bell-shaped amplitude characteristic of a filter that is configured to process an audio signal, comprising preparing a high-frequency parameter related to a high-frequency side characteristic on a high-frequency side of the frequency response and a low-frequency parameter related to a low-frequency side characteristic on a low-frequency side of the frequency response, independently changing the high-frequency parameter or the low-frequency parameter in accordance with a first change instruction, changing both of the high-frequency parameter and the low-frequency parameter in conjunction with each other in accordance with a second change instruction, and controlling a slope on the high-frequency side and a slope on the low-frequency side of the bell-shaped amplitude characteristic of the frequency response, by using the high-frequency parameter and the low-frequency parameter.

A control device according to the present disclosure is a control device for controlling a frequency response having a bell-shaped amplitude characteristic of a filter that is configured to process an audio signal. The control device comprises one or more processors, and one or more computer-readable devices that store at least one program that is executed by the one or more processors. The one or more processors are configured to, by executing the at least one program, prepare a high-frequency parameter related to a the high-frequency side characteristic on a high-frequency side of the frequency response, and a low-frequency parameter related to a low-frequency side characteristic on a low-frequency side of the frequency response, independently change the high-frequency parameter or the low-frequency parameter in accordance with a first change instruction, change both of the high-frequency parameter and the low-frequency parameter in conjunction with each other in accordance with a second change instruction, and control a slope on the high-frequency side and a slope on the low-frequency side of the bell-shaped amplitude characteristic of the frequency response, by using the high-frequency parameter and the low-frequency parameter.

A non-transitory computer-readable medium storing a program according to the present disclosure causes a computer, which controls the frequency response having a bell-shaped amplitude characteristic of a filter that is configured to process an audio signal, to execute a process. The process comprises preparing a high-frequency parameter related to a high-frequency side characteristic on a high-frequency side of the frequency response, and a low-frequency parameter related to a low-frequency side characteristic on a low-frequency side of the frequency response, independently changing the high-frequency parameter or the low-frequency parameter in accordance with a first change instruction, change both of the high-frequency parameter and the low-frequency parameter in conjunction with each other in accordance with a second change instruction, and controlling a slope on the high-frequency side and a slope on the low-frequency side of the bell-shaped amplitude characteristic of the frequency response, by using the high-frequency parameter and the low-frequency parameter.

DETAILED DESCRIPTION OF THE EMBODIMENTS

Selected embodiments will now be explained in detail below, with reference to the drawings as appropriate. It will be apparent to those skilled from this disclosure that the following descriptions of the embodiments are provided for illustration only and not for the purpose of limiting the invention as defined by the appended claims and their equivalents.

1. Hardware Configuration of Control Device

Figure 1:
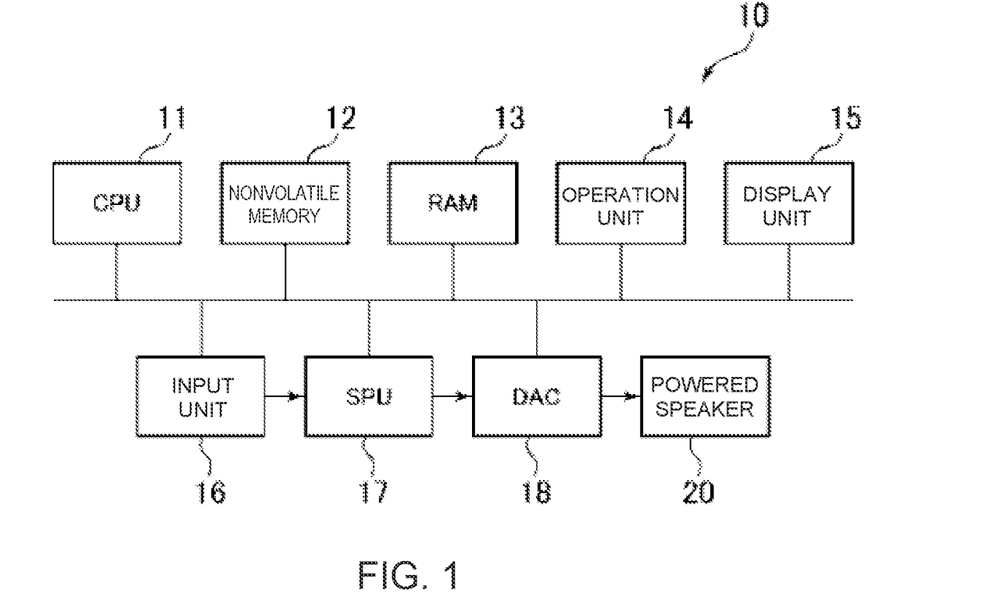
FIG. 1 is a diagram showing one example of a control device according to an embodiment.

One example of an embodiment of the present disclosure will be described below based on the drawings. FIG. 1 is a diagram showing one example of a control device according to the embodiment. A control device 10 controls the frequency response of a filter that processes an audio signal. For example, the control device 10 is a digital mixer, a signal processor, an audio amplifier, an electronic musical instrument, a personal computer, a tablet terminal, a smartphone, or a digital assistant.

The audio signal is a digital or analog signal representing sound. A filter is a circuit that processes and outputs an audio signal that has been input. The filter of this embodiment is a finite length FIR filter. In order to simulate the operability and the amplitude characteristic, the amplitude characteristic of each individual peaking filter is bell-shaped, similarly to a Biquad filter. The frequency response is a filter characteristic in the frequency domain and is defined by the amplitude and phase characteristics. The filter coefficients are set based on the frequency response (amplitude characteristic) curve set by the user, and a filter with the desired frequency response (amplitude characteristic) is obtained.

In the embodiment, "obtained" means obtained as a result of processing. For example, since the frequency response is obtained as a result of a process based on high-frequency parameter, etc., described further below, the control device 10 "obtains" the frequency response. "Obtain" can be expressed differently as create, define, or generate. On the other hand, "to acquire" means to receive. For example, since information specified by a user is received from the outside, the control device 10 acquires said information. "Acquire" can be expressed differently as receive. Thus, in the embodiment, the terms "obtain" and "acquire" are used differently in this way.

As shown in FIG. 1, the control device 10 includes a CPU (Central Processing Unit) 11, a nonvolatile memory 12, a RAM 13 (Random Access Memory), an operation unit 14, a display unit 15, an input unit 16, an SPU (Signal Processing Unit) 17, and a DAC (Digital Analog Converter) 18. The control device 10 is connected to a powered speaker 20. The speaker 20 can be integrated with the control device 10.

The CPU 11, which is one example of an electronic controller, includes one or plurality of processors. The term "electronic controller" as used herein refers to hardware that executes software programs. The CPU 11 executes a prescribed process based on one or more programs and data stored in the nonvolatile memory 12. The control device 10 is configured to comprise, instead of the CPU 11 or in addition to the CPU 11, programmable logic devices such as a DSP (Digital Signal Processor), an FPGA (Field Programmable Gate Array), an ASIC (Application Specific Integrated Circuit), and the like. The nonvolatile memory 12 is any nonvolatile computer storage device or any non-transitory nonvolatile computer-readable medium with the sole exception of a transitory, propagating signal. For example, the nonvolatile memory 12 is a memory unit such as a ROM (Read Only Memory), an EEPROM (Electrically Erasable Programmable Read Only Memory), a flash memory, or a hard disk. The RAM 13 is one example of volatile memory. The nonvolatile memory 12 and the RAM 12 are examples of one or more computer-readable devices (computer memories). The operation unit 14 is an input device (user operable input), such as a touch panel, keyboard, mouse, button, lever, etc. The display unit 15 is a display such as a liquid-crystal display or an organic EL display, for example.

The input unit 16 acquires an audio signal. In the embodiment, the input unit 16 acquires a digital audio signal. The input unit 16 can acquire an analog audio signal. In this case, the input unit 16 would use an A/D converter to convert the analog audio signal into a digital audio signal. For example, the input unit 16 includes an interface for receiving an audio signal input from the outside. The input unit 16 can acquire sound data stored in the nonvolatile memory 12. The input unit 16 inputs the acquired audio signal to the SPU 17. The SPU 17 includes a filter that processes the input audio signal.

Figure 2:
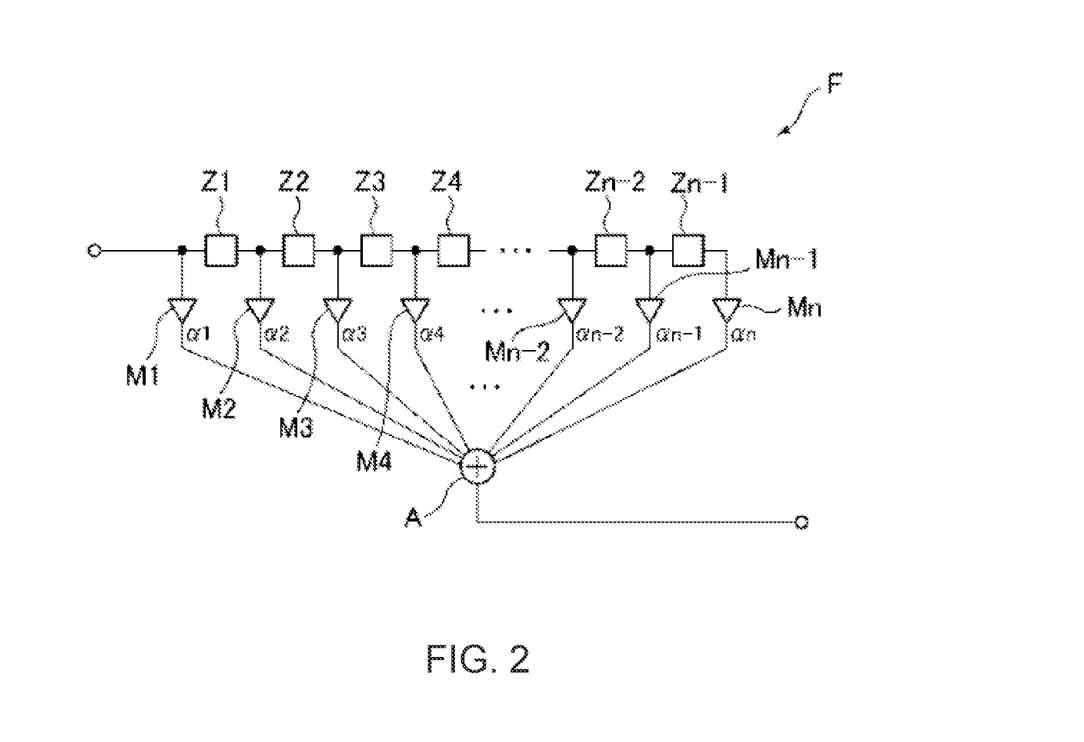
FIG. 2 is a diagram showing an example of an SPU filter.

FIG. 2 is a diagram showing an example of a filter of the SPU 17. As shown in FIG. 2, a filter F includes delay circuits Z1-Zn−1, and multipliers M1-Mn. n is the number of taps of the filter F. n can be any positive integer. Coefficients α1-αn are set for each of the multipliers M1-Mn. Coefficients α1-αn have values corresponding to the overall response, described further below. The filter F is an FIR filter that convolves the coefficients α1-αn with the audio signal.

The audio signal input from the input unit 16 is input to multiplier M1 and delay circuit Z1. The audio signal input to delay circuit Z1 is delayed by a predetermined time and input to multiplier M2 and delay circuit Z2. In the same way, the audio signal is delayed by each of the delay circuits Z3-Zn−1. The delayed audio signal is input to each of the multipliers M3-Mn.

Each of the multipliers M1-Mn multiplies its input audio signal by the respective coefficients α1-αn. The products of the audio signal and the respective coefficient α1-αn of multipliers M1-Mn are input to an adder A. The adder A adds the audio signals output from each of the multipliers M1-Mn. Adder A inputs the added audio signal to the DAC 18.

The DAC 18 is a circuit for converting a digital audio signal into an analog audio signal. The DAC 18 outputs the converted analog audio signal to the powered speaker 20. The speaker 20 outputs sound corresponding to the input analog audio signal.

The hardware configuration of the control device 10 is not limited to the example described above. For example, the control device 10 can include a communication interface for wired or wireless communication. Also, for example, the control device 10 can include a reading device (e.g., an optical disc drive or a memory card slot) that reads computer-readable information from a storage medium. Also, for example, the control device 10 can include an input/output terminal (e.g., a USB port) for inputting/outputting data. In the embodiment, the program and data described as being stored in the nonvolatile memory 12 can be supplied to the control device 10 via a communication interface, a reading device, or an input/output terminal.

2. Functions Realized by the Control Device

Figure 3:
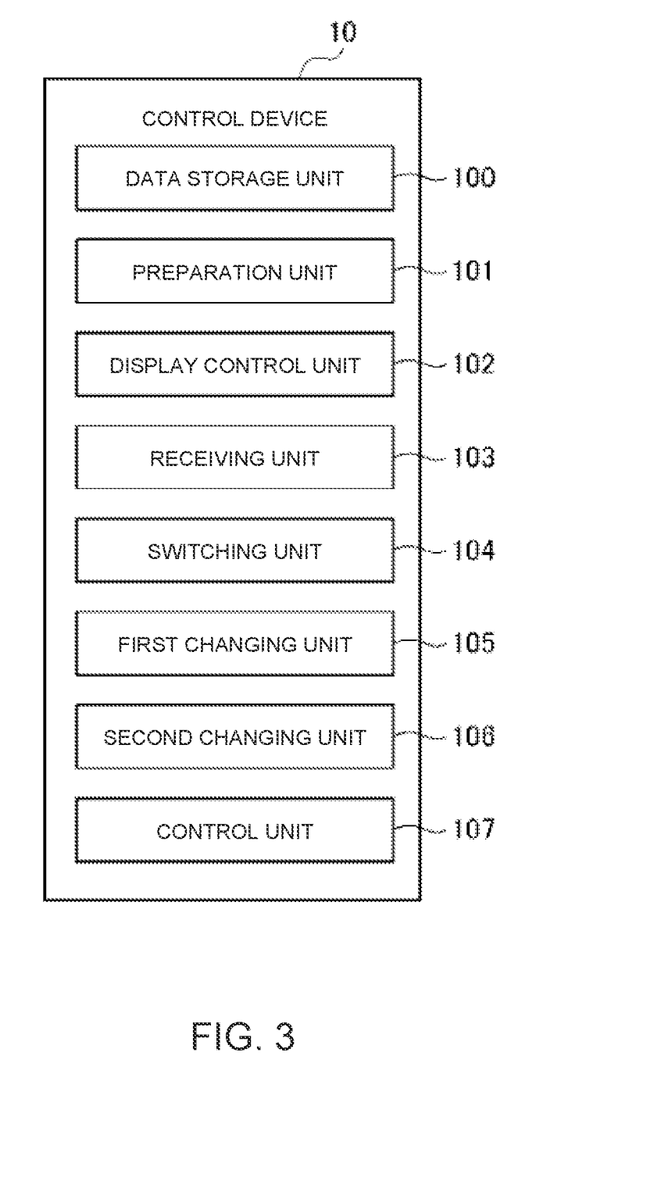
FIG. 3 is a block diagram showing an example of a function realized by the control device.

FIG. 3 is a block diagram showing an example of a function realized by the control device 10. As shown in FIG. 3, the control device 10 executes the one or more programs stored in the one or more computer-readable devices such as the nonvolatile memory 12 to realize a data storage unit 100, a preparation unit 101, a display control unit 102, a receiving unit 103, a switching unit 104, a first changing unit 105, a second changing unit 106, and a control unit 107. The data storage unit 100 is primarily realized by the nonvolatile memory 12, and the other functions are primarily realized by the CPU 11.

2-1. Data Storage Unit

Figure 4:
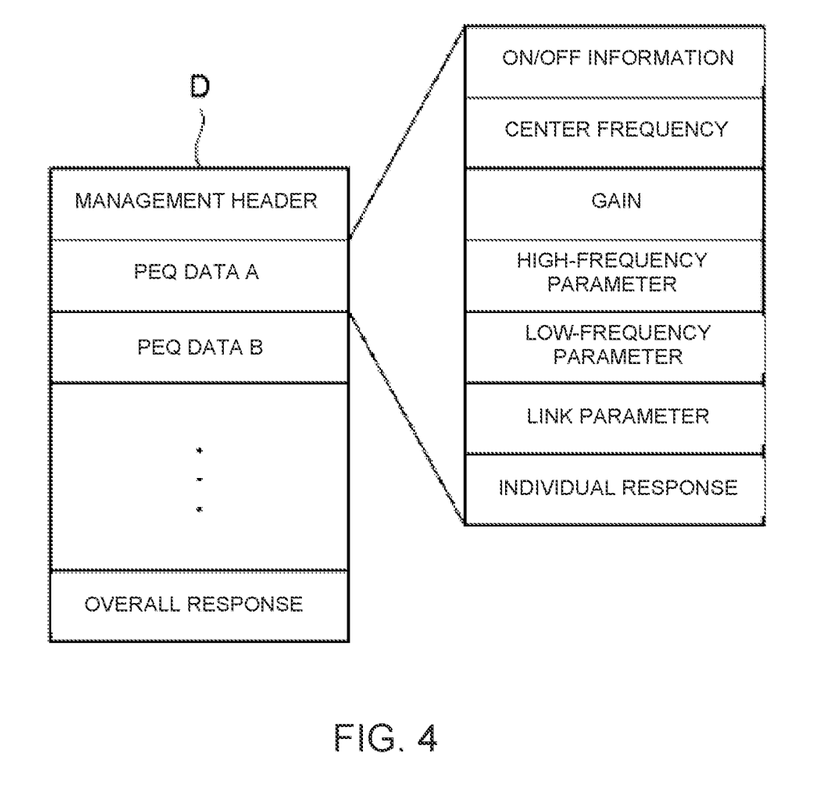
FIG. 4 is a diagram showing an example of data storage of related data.

Related data related to the frequency response are stored in the data storage unit 100. FIG. 4 is a diagram showing an example of the storage of related data. As shown in FIG. 4, related data D include a control header, PEQ data, and the overall response. The control header is information for managing the related data. For example, the control header includes the names, etc., of the related data.

The PEQ data indicate the content of the settings of the PEQ. The PEQ data are prepared for each PEQ. For example, The PEQ data include on/off information, the center frequency, gain, high-frequency parameter, low-frequency parameter, link parameter, and individual response.

The on/off information indicates whether a PEQ is on (enabled)/off (disabled). The on/off information shows either a value indicating that the PEQ is on or a value indicating that the PEQ is off. If the PEQ on/off information is on, the individual response for that PEQ is added to the overall response. If the PEQ on/off information is off, the individual response for that PEQ is not added to the overall response.

The high-frequency parameter is related to the characteristic on the high-frequency side of the individual response. The low-frequency parameter is related to the characteristic on the low-frequency side of the individual response. The high-frequency side refers to the frequencies above a prescribed frequency. The low-frequency side refers to the frequencies below the prescribed frequency. In the embodiment, the prescribed frequency is the center frequency, but a different frequency than the center frequency can be used as a reference for designating the high- and low-frequency sides.

Figure 5:
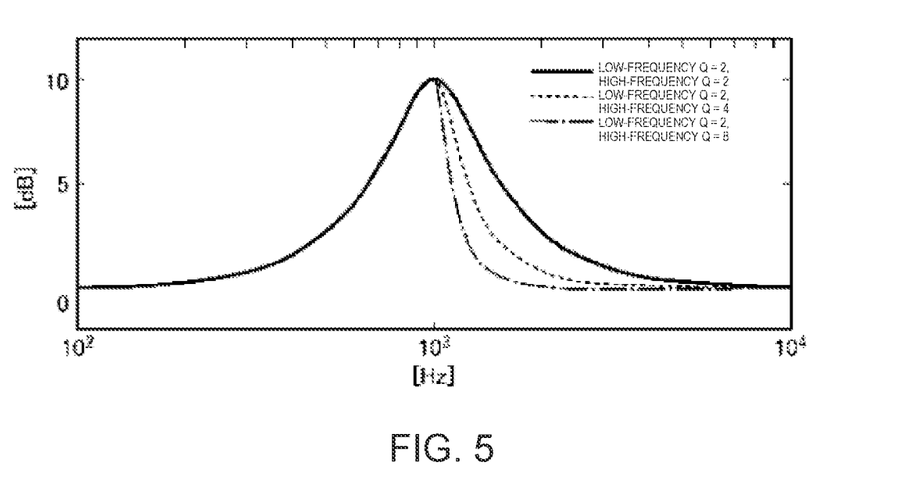
FIG. 5 is an explanatory diagram of a high-frequency parameter and a low-frequency parameter.
Figure 6:
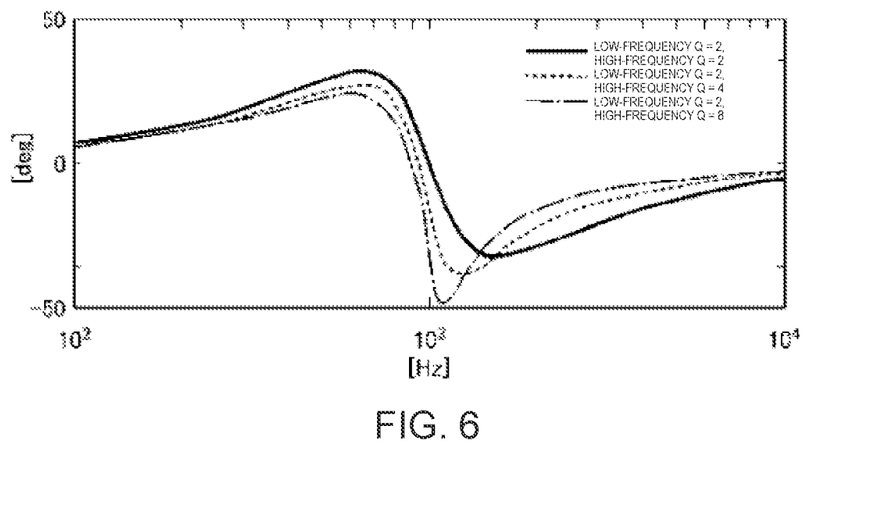
FIG. 6 is an explanatory diagram of a high-frequency parameter and a low-frequency parameter.

FIGS. 5 and 6 are explanatory diagrams for the high-frequency and low-frequency parameters. The high-frequency and low-frequency parameters are referred to as Q values (quality factor values) here since they indicate the sharpness of the amplitude characteristic in the same manner as the Q values of the Biquad filter. The high-frequency and low-frequency parameters exhibit the same behavior (change) with respect to the amplitude characteristic of the filter as that of the Q value of the Biquad filter. In FIGS. 5 and 6, the high-frequency parameter is referred to as "high-frequency Q," and the low-frequency parameter is referred to as low-frequency Q." In FIGS. 5 and 6, since the center frequency is 1000 Hz, the high-frequency side includes the frequencies above 1000 Hz. The low-frequency side includes the frequencies below 1000 Hz.

FIG. 5 shows the effects that the high-frequency and low-frequency parameters of a PEQ have on the amplitude characteristic of the individual response of that PEQ. The amplitude characteristic is displayed on the horizontal axis, which indicates frequency, and the vertical axis, which indicates amplitude. FIG. 6 shows the effects that the high-frequency and low-frequency parameters of a PEQ have on the amplitude characteristic of the individual response of that PEQ. The phase characteristic is displayed on the horizontal axis, which indicates frequency, and the vertical axis, which indicates the phase lead or lag in degrees. As shown in FIGS. 5 and 6, the amplitude and phase characteristic curves can be made asymmetric in accordance with the high-frequency and low-frequency parameters.

As shown in FIGS. 5 and 6, when the high-frequency parameter (high-frequency Q) changes, the slope of the high-frequency side curve changes. The high-frequency side curve corresponding to a certain high-frequency Q has the same shape as the curve on the high-frequency side with respect to the center frequency of the amplitude characteristic of a Biquad filter corresponding to the same Q value as said high-frequency Q. When the low-frequency parameter (low-frequency Q) changes, the slope of the low-frequency side curve changes. The low-frequency side curve corresponding to a certain low-frequency Q has the same shape as the curve on the low-frequency side with respect to the center frequency of the amplitude characteristic of a Biquad peaking filter corresponding to the same Q value as said low-frequency Q. In the examples of FIGS. 5 and 6, the high-frequency parameter and the low-frequency parameter affect the respective slope of the curve, particularly near the center frequency. Upper limit values and lower limit values are respectively set for the high-frequency parameter and the low-frequency parameter.

In the embodiment, the slope of the high-frequency side curve and of the low-frequency side curve is determined in accordance with the relative relationship between the high-frequency parameter and the low-frequency parameter. For example, as the high-frequency parameter becomes relatively larger, the slope of the high-frequency side curve becomes steeper. As the low-frequency parameter becomes relatively larger, the slope of the low-frequency side curve becomes steeper. When the high-frequency and low-frequency parameters are the same, the curve of the amplitude characteristic becomes symmetrical at the center frequency, and the curve of the phase characteristic becomes pointwise symmetrical at the center frequency. The amplitude characteristic curve for this case has the same shape as the amplitude characteristic curve of the Biquad peaking filter having the same Q values as the high-frequency Q and the low-frequency Q. These curves are controlled by the control unit 107, described further below.

The relationship among the high-frequency parameter, the low-frequency parameter, and the slopes of the curves is not limited to the example of the embodiment. It is sufficient if the high-frequency parameter affects the slope of the high-frequency side curve and if the low-frequency parameter affects the slope of the low-frequency side curve.

Alternatively, for example, the slope of the curve can be determined in accordance with an absolute value instead of a relative relationship, as in this embodiment. For example, the slope of the high-frequency side curve can become steeper as the high-frequency parameter decreases, despite the value of the low-frequency parameter. The slope of the low-frequency side curve can become steeper as the low-frequency parameter decreases, despite the value of the high-frequency parameter. On the other hand, the slope of the high-frequency side curve can become steeper as the high-frequency parameter increases, and the slope of the low-frequency side curve can become steeper as the low-frequency parameter increases.

The link parameter provides information indicating whether linkage is on (enabled) or off (disabled). Linkage means that the high-frequency and low-frequency parameters are linked. When the link is on, both the high-frequency and low-frequency parameters are changed in response to a single instruction. When the link is off, a separate instruction is required to change either the high-frequency parameter or the low-frequency parameter. In the embodiment, when the link parameter is off, the process of the first changing unit 105 is executed. When the link parameter is on, the process of the second changing unit 106 is executed.

An individual response is a PEQ-specific frequency response. In this embodiment, a case will be described in which the individual responses are expressed in the frequency domain, but the individual responses can be inverse-Fourier transformed and expressed in the time domain. The individual responses in the time domain are expressed with the horizontal axis as the time axis (so-called impulse response). The overall response is the frequency response obtained by adding the individual responses of the PEQs whose on/off information is on. The case in which the overall response is expressed in the frequency domain is described in like fashion, but it can also be expressed in the time domain.

The information included in the PEQ data is not limited to the example described above. The PEQ data can include information related to the PEQ settings. For example, a parameter related to the attenuation of the amplitude characteristic can be contained in the PEQ data. This parameter indicates the frequencies around the cutoff frequency at which the gain is reduced by half. For example, if this parameter is 1, the gain is halved at +1 octave from the cutoff frequency.

2-2. Preparation Unit

The preparation unit 101 prepares the high-frequency parameter related to the characteristic (high-frequency side characteristic) on the high-frequency side of the frequency response and the low-frequency parameter related to the characteristic (low-frequency side characteristic) on the low-frequency side of the frequency response. Preparation means acquiring the information necessary for the execution of a prescribed process. The high-frequency and low-frequency parameters are prepared for processing by the first changing unit 105 and the second changing unit 106. In the embodiment, the high-frequency and low-frequency parameters are contained in related data D, so that the preparation unit 101 refers to related data D to prepare the high-frequency and low-frequency parameters.

The high-frequency and low-frequency parameters can be stored in an external computer or information storage medium instead of the data storage unit 100. In this case, the preparation unit 101 prepares the high-frequency and low-frequency parameters by acquiring these parameters from the computer or information storage medium. Alternatively, for example, the user can specify these initial values. In this case, the preparation unit 101 prepares the high-frequency and low-frequency parameters by acquiring the initial values specified by the user.

2-3. Display Control Unit

Figure 7:
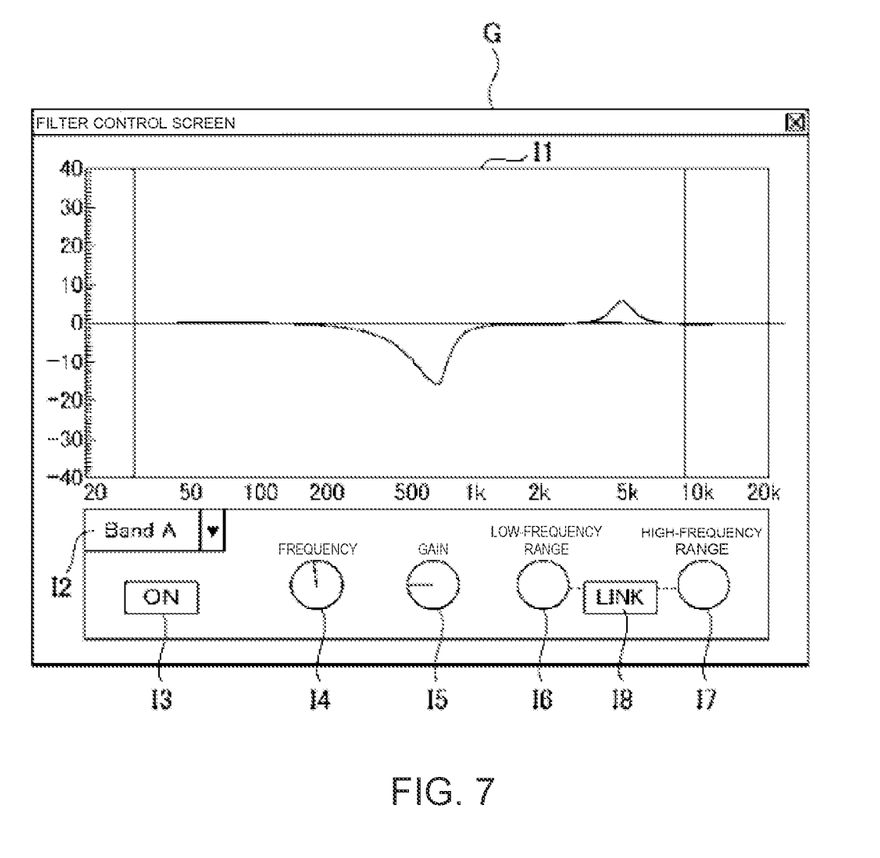
FIG. 7 is a diagram showing an example of a filter control screen.

The display control unit 102 causes the display unit 15 to display a filter control screen. The filter control screen is a user interface used for setting the filter F. FIG. 7 is a diagram showing an example of the filter control screen. In this embodiment, a filter control screen G for specifying the amplitude characteristic is used as an example, but the phase characteristic can also be specified using filter control screen G. As shown in FIG. 7, the filter control screen G displays an amplitude characteristic image I1 and instruction images I2-I8.

The amplitude characteristic image I1 shows the amplitude characteristic of the individual response that is being set. In the embodiment, the individual response of any one PEQ of the PEQs for which PEQ data are stored in related data D is set. The name of the PEQ being set is displayed on the instruction image I2. The user can change the PEQ to be set on the instruction image I2. The user can specify the amplitude characteristic by changing the shape of the curve of the amplitude characteristic image I1 by dragging the mouse, or the like.

The instruction image I3 is used to change the on/off information. The user changes on/off indicated by the on/off information by selecting the instruction image I3. In the example of FIG. 7, the on/off information indicates ON, and the instruction image I3 displays the character string "ON." When the user changes the on/off information to OFF, the instruction image I3 displays the character string "OFF."

The instruction image I4 is used to change the center frequency. The instruction image I5 is used to change the gain. The instruction image I6 is used to change the low-frequency parameter. The instruction image I7 is used to change the high-frequency parameter. In the embodiment, each of the instruction images I4-I7 has the shape of a knob used in the user interface. For example, the user rotates each of the instruction images I4-I7 to respectively specify the center frequency, the gain, the low-frequency parameter, and the high-frequency parameter. For example, the values increase as the instruction images I4-I7 are rotated clockwise. The instruction image I6 can be configured such that the low-frequency parameter increases as it is rotated counterclockwise.

The instruction image I8 is used to change the link parameter. The user selects the instruction image I8 to turn the link parameter on/off. In the example of FIG. 7, the link parameter indicates ON, and the instruction image I8 displays the character string "LINK." When the user turns the link parameter off, the instruction image I8 displays the character string "OFF." When the link parameter is ON, the display can show the instruction images I6 and I7 as being connected, as shown in FIG. 7.

2-4. Receiving Unit

The receiving unit 103 receives instructions from the user. For example, the receiving unit 103 receives a first change instruction. The first change instruction is an instruction for causing the first changing unit 105 to execute a process. In other words, the first change instruction is an instruction to independently change either the high-frequency parameter or the low-frequency parameter without linking the high-frequency parameter and the low-frequency parameter to each other. The first change instruction is an instruction to increase or decrease the high-frequency parameter or the low-frequency parameter.

For example, the receiving unit 103 receives a high-frequency change instruction or a low-frequency change instruction as the first change instruction. The high-frequency change instruction is an instruction to change the high-frequency parameter. The low-frequency change instruction is an instruction to change the low-frequency parameter. In the present embodiment, the first change instruction is meant to include these two instructions.

In the example of filter control screen G of FIG. 7, rotating the instruction image I7 when the link parameter is in the off state corresponds to a high-frequency change instruction. Rotating the instruction image I7 in a prescribed direction is a high-frequency change instruction that indicates an increase in the high-frequency parameter. Rotating the instruction image I7 in the opposite direction to this prescribed direction is a high-frequency change instruction that indicates a decrease in the high-frequency parameter.

Rotating the instruction image I6 when the link parameter is in the off state corresponds to a low-frequency change instruction. Rotating the instruction image I6 in a prescribed direction is a low-frequency change instruction that indicates an increase in the low-frequency parameter. Rotating the instruction image I6 in the opposite direction to this prescribed direction is a low-frequency change instruction that indicates a decrease in the low-frequency parameter.

For example, the receiving unit 103 receives a second change instruction. The second change instruction causes the second changing unit 106 to perform a process. In other words, the second change instruction changes both the high-frequency parameter and the low-frequency parameter in conjunction with each other, rather than changing either the high-frequency parameter or the low-frequency parameter independently of the other.

In the embodiment, the first change instruction and the second change instruction are described as the same instruction, but the first change instruction and the second change instruction can be different instructions, as in the modified example described further below. Thus, the receiving unit 103 receives a high-frequency change instruction or a low-frequency change instruction as the second change instruction. In the present embodiment, if the link parameter is on, the high-frequency change instruction and the low-frequency change instruction are handled as a second change instruction. If the link parameter is off, the high-frequency change instruction and the low-frequency change instruction are handled as a first change instruction.

The first change instruction and the second change instruction can be instructions that can be input from the operation unit 14 and are not limited to the example of the present embodiment. The first change instruction and the second change instruction can be any preset instruction. For example, the first change instruction and the second change instruction can be a click, double click, drag and drop, tap, double tap, flick, pinch, spread, a manipulation of a physical switch or lever, a depressed key on a keyboard, etc.

Further, an instruction received by the receiving unit 103 is not limited to the first change instruction and the second change instruction. The receiving unit 103 can receive other instructions. For example, the receiving unit 103 receives a switching instruction. A switching instruction switches between a first mode and a second mode, described further below. In the embodiment, the switching instruction is carried out by selecting the instruction image I8. Like the first change instruction and the second change instruction, the switching instruction can be any instruction that can be input from the operation unit 14.

2-5. Switching Unit

The switching unit 104 switches between the first mode for receiving the first change instruction and the second mode for receiving the second change instruction, in accordance with the switching instruction. In the first mode, the first changing unit 105 performs a process. In other words, in the first mode, either the high-frequency parameter or the low-frequency parameter is changed independently without linking the high-frequency parameter and the low-frequency parameter. In the embodiment, an off link parameter implies the first mode.

In the second mode, the second changing unit 106 performs a process. In other words, in the second mode, both the high-frequency parameter and the low-frequency parameter are changed in conjunction with each other. In the embodiment, the link parameter turns on when the mode is switched from the first mode to the second mode. The link parameter turns off when the mode is switched from the second mode to the first mode. The switching unit 104 changes the link parameter to change modes. In the embodiment, an on link parameter implies the second mode.

The switching unit 104 changes the link parameter in accordance with a switching instruction to switch between the first mode and the second mode. The switching unit 104 changes the link parameter from off to on to switch from first mode to second mode. The switching unit 104 changes the link parameter from on to off to switch from second mode to first mode.

2-6. First Changing Unit

The first changing unit 105 changes either the high-frequency parameter or the low-frequency parameter independently of the other parameter in accordance with the first change instruction. The first changing unit 105 changes either the high-frequency parameter or the low-frequency parameter independently of the other in accordance with the first change instruction. Changing independently means that the low-frequency parameter does not change even if the high-frequency parameter changes, and that the high-frequency parameter does not change even if the low-frequency parameter changes.

For example, the first changing unit 105 controls the amount of change of either the high-frequency parameter or the low-frequency parameter in accordance with the instructed amount of the first change instruction. The instructed amount is the instructed quantity. The instructed amount can also be referred to as the operation amount. In the present embodiment, the amount of rotation (rotation angle) of instruction images I6, I7 corresponds to the instructed amount. The first changing unit 105 increases the amount of change as the instructed amount increases. The relationship between the instructed amount and the amount of change can be preset by a mathematical formula, or the like. For example, the amount of change is proportional to the instructed amount.

The instructed amount can have any meaning corresponding to the type of instruction. For example, the number of clicks, the number of double clicks, the travel distance for a drag and drop, the number of taps, the number of double taps, the travel distance of a flick, the travel distance of a pinch, the travel distance of a spread, the amount of movement of the operation on a physical switch or lever, the number of key presses on a keyboard, etc., can correspond to the instructed amount.

When the first change instruction is used to change the high-frequency parameter, the first changing unit 105 changes the high-frequency parameter without changing the low-frequency parameter. In the embodiment, since a change in the high-frequency parameter is indicated by rotating the instruction image I7, the first changing unit 105 changes the high-frequency parameter independently of the low-frequency parameter when the user rotates the instruction image I7.

When the first change instruction is used to change the low-frequency parameter, the first changing unit 105 changes the low-frequency parameter without changing the high-frequency parameter. In the embodiment, since a change in the low-frequency parameter is indicated rotating the instruction image I6, the first changing unit 105 changes the low-frequency parameter independently of the high-frequency parameter when the user rotates the instruction image I6.

In the embodiment, the first mode (link parameter in the off state) and the second mode (link parameter in the on state) are switched; in the first mode, the first changing unit 105 changes the high-frequency parameter in accordance with a high-frequency change instruction and the low-frequency parameter in accordance with a low-frequency change instruction. The first changing unit 105 does not perform any processes in the second mode. The first changing unit 105 performs processes on the condition that the current mode is the first mode.

2-7. Second Changing Unit

The second changing unit 106 changes both the high-frequency and low-frequency parameters in conjunction with each other in accordance with the second change instruction. Changing in conjunction means that both the high-frequency and low-frequency parameters are changed with a single instruction. The changes in the high-frequency parameter and the low-frequency parameter are correlated. For example, the second changing unit 106 controls the amount of change in the high-frequency parameter and in the low-frequency parameter in accordance with the instructed amount of the second change instruction. The meaning of the instructed amount is described above. The second changing unit 106 increases the amount of change as the instructed amount is increased. The relationship between the instructed amount and the amount of change can be preset by a mathematical formula, or the like. For example, the amount of change amount can be proportional to the instructed amount.

In the embodiment, the second changing unit 106 changes both the high-frequency and low-frequency parameters in the same way in accordance with the second change instruction. The high-frequency and low-frequency parameters are changed in the same way. For example, the amount of change in the high-frequency parameter and the amount of change in the low-frequency parameter are the same. When the high-frequency parameter increases, the low-frequency parameter also increases. When the high-frequency parameter decreases, the low-frequency parameter also decreases.

For example, the second changing unit 106 changes both the high-frequency and low-frequency parameters in accordance with the second change instruction such that the difference between the high-frequency and low-frequency parameters or the ratio of the high-frequency parameter to the low-frequency parameter is maintained. Maintaining the difference or the ratio means that the difference or the ratio after the change is the same as it was before the change. The second changing unit 106 calculates the difference between the high-frequency and low-frequency parameters and the ratio of the high-frequency parameter to the low-frequency parameter when the second change instruction is received. The second changing unit 106 changes both the high-frequency and low-frequency parameters so that the calculated difference or ratio is maintained.

The high-frequency and low-frequency parameters can change differently. For example, the amount of change in the high-frequency parameter can be different from the amount of change in the low-frequency parameter. When the high-frequency parameter increases, the low-frequency parameter can decrease. When the high-frequency parameter decreases, the low-frequency parameter can increase. That is, the high-frequency and low-frequency parameters can change in opposite directions rather than in the same direction. In this case, the second changing unit 106, in accordance with the second change instruction, increases the high-frequency parameter and decreases the low-frequency parameter or decreases the high-frequency parameter and increases the low-frequency parameter.

If an increase is indicated by the second change instruction, the second changing unit 106 increases both the high-frequency and low-frequency parameters. In the embodiment, since an increase is indicated when instruction images I6, I7 are rotated in a prescribed direction, the second changing unit 106 increases both the high-frequency parameter and the low-frequency parameter when the user rotates instruction images I6, I7 in the prescribed direction.

If a decrease is indicated by the second change instruction, the second changing unit 106 decreases both the high-frequency and low-frequency parameters. In the embodiment, since a decrease is indicated when instruction images I6, I7 are rotated in the opposite direction to the prescribed direction, the second changing unit 106 decreases both the high-frequency and low-frequency parameters when the user rotates instruction images I6, I7 in the opposite direction to the prescribed direction.

In the embodiment, even when the second mode is entered, the same high-frequency or low-frequency change instructions that were received in the first mode can be received, so that the second changing unit 106 changes both the high-frequency and low-frequency parameters irrespective of whether a high-frequency change instruction or a low-frequency change instruction is received in the second mode. In the embodiment, in the second mode, the case in which the same change is made when a high-frequency change instruction is received and when a low-frequency change instruction is received was described, but the changes can be different from each other. For example, the amount of change per unit instruction amount when a high-frequency change instruction is received can be different from the amount of change per unit instruction amount when a low-frequency change instruction is received. The second changing unit 106 executes the process on the condition that the current mode is the second mode.

2-8. Control Unit

The control unit 107 uses the high-frequency and low-frequency parameters to control the frequency response. The control unit 107 determines the shape of the amplitude characteristic curve and the shape of the phase characteristic curve. The control unit 107 controls the slope of the high-frequency side curve and the slope of the low-frequency side curve based on the high-frequency and low-frequency parameters. In the present embodiment, since PEQ data are prepared for each PEQ, the control unit 107 controls the individual response of each PEQ based on the high-frequency and low-frequency parameters in the PEQ data for each PEQ. Details of the control method of the control unit 107 in the present embodiment are as described above with reference to FIGS. 5 and 6.

3. Process Executed by the Control Device

Figure 8:
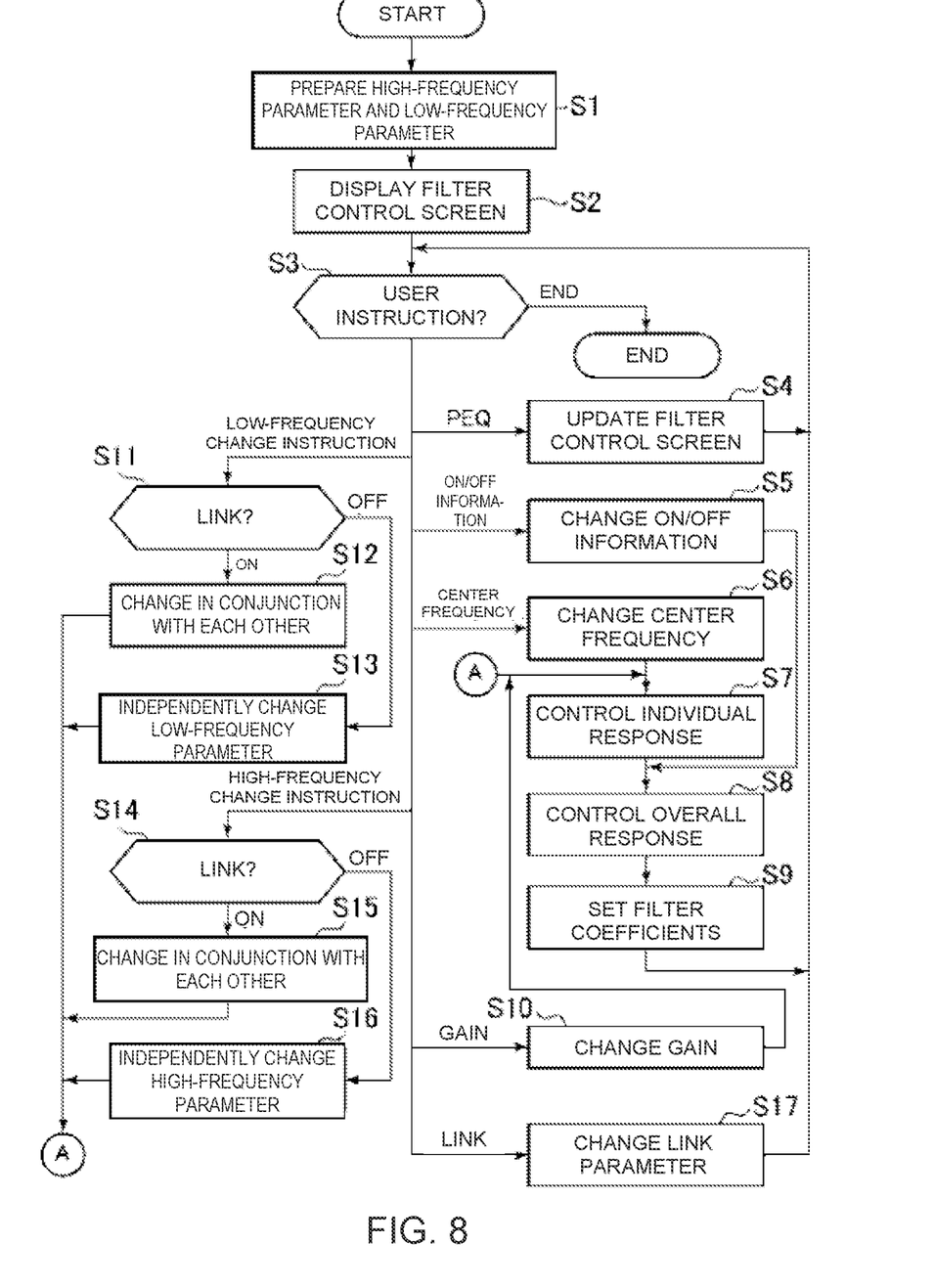
FIG. 8 is a flowchart showing an example of a process executed by the control device.

FIG. 8 is a flowchart showing an example of a process executed by the control device 10. This process is executed as a result of the CPU 11 operating in accordance with a program stored in the nonvolatile memory 12. This process is an example of a process executed by the functional block shown in FIG. 3. This process is an example of a process for controlling the frequency response of a filter that processes audio signals.

As shown in FIG. 8, the CPU 11 prepares the high-frequency and low-frequency parameters by referring to related data D stored in the nonvolatile memory 12 (S1). In S1, the CPU 11 acquires the PEQ data of the PEQ to be set to prepare the high-frequency and low-frequency parameters. The CPU 11 selects any of the PEQs whose PEQ data are stored in related data D as the setting target. The CPU 11 also refers to other information included in the PEQ data to carry out the preparation.

The CPU 11 causes the display unit 15 to display the filter control screen G based on the PEQ data of the PEQ to be set (S2). In S2, the CPU 11 displays the amplitude characteristic of the individual response, which is included in the PEQ data of the PEQ to be set, in the amplitude characteristic image I1 of the filter control screen G. The CPU 11 displays the on/off information and the link parameter included in the PEQ data respectively in the positions of images I3 and I8.

The CPU 11 identifies the user instruction based on the detection signal of the operation unit 14 (S3). In S3, instructions using the instruction images I2-I8 are received.

In S3, when a change in the PEQ is indicated from the instruction image I2 (S3; PEQ), the CPU 11 updates the filter control screen G based on the PEQ data of the PEQ data specified by the user (S4). In S4, the CPU 11 refers to the PEQ data of the PEQ specified by the user, from among the related data, and updates the filter control screen G based on the individual response, the on/off information, and the link parameter.

In S3, if a change in the on/off information is indicated from the instruction image I3 (S3; on/off information), the CPU 11 changes the on/off information in accordance with the user instruction (S5) and proceeds to the process of S8, described further below. Upon proceeding to the process of S8, the overall response is updated in accordance with the change in the on/off information in S5.

In S3, if a change in the center frequency is indicated from the instruction image I4 (S3; center frequency), the CPU 11 changes the center frequency in accordance with the user instruction (S6). In S6, the CPU 11 increases or decreases the center frequency in accordance with the amount instructed with respect to the instruction image I4.

The CPU 11 controls the individual response based on the latest PEQ data (S7). In S7, the CPU 11 refers to the related data D to update the individual response of the PEQ being set. The display of the amplitude characteristic image I1 on the filter control screen G is also updated in accordance with the individual response.

The CPU 11 sums the individual responses and controls the overall response (S8). In S8, the CPU 11 sums the individual responses of the PEQs whose on/off information is ON from among the related data D and controls the overall response. The summation of the individual responses can be performed by using a known calculation formula.

The CPU 11 sets the coefficients of the filter F based on the overall response (S9). In S9, the CPU 11 takes the inverse Fourier transform of the overall response and sets the coefficients for each tap based on the time-domain curve.

In S3, if a change in the gain is indicated from the instruction image I5 (S3; gain), the CPU 11 changes the gain in accordance with the user instruction (S10) and proceeds to the process of S7. In S10, the CPU 11 increases or decreases the gain in accordance with the amount instructed in accordance with the instruction image I4. Upon proceeding to the process of S7, the individual response is controlled in accordance with the change in gain in S10.

In S3, if a low-frequency change instruction is received from the instruction image I6 (S3; low-frequency change instruction), the CPU 11 refers to the link parameter of the PEQ being set (S11). If the link parameter is on (S11; on), the CPU 11 changes both the high-frequency parameter and the low-frequency parameter in conjunction with each other in accordance with the user's low-frequency change instruction (S12) and proceeds to the process of S7. In S12, the CPU 11 increases or decreases the high-frequency and low-frequency parameters in accordance with the instructed amount with respect to the instruction image I6. Upon proceeding to the process of S7, the individual response is controlled in accordance with the change in the high-frequency and low-frequency parameters in S12.

In S11, if the link parameter is off (S11: off), the CPU 11 changes the low-frequency parameter independently of the high-frequency parameter in accordance with the user's low-frequency change instruction (S13) and proceeds to the process of S7. In S13, the CPU 11 increases or decreases the low-frequency parameter in accordance with the instructed amount with respect to the instruction image I6. Upon proceeding to the process of S7, the individual response is controlled in accordance with the change in the low-frequency parameter in S13.

In S3, if a high-frequency change instruction is received from the instruction image I7 (S3; high-frequency change instruction), the CPU 11 refers to the link parameter of the PEQ being set (S14). If the link parameter is on (S14; on), the CPU 11 changes both the high-frequency and low-frequency parameters in conjunction with each other in accordance with the high-frequency change instruction (S15) and proceeds to the process of S7. In S15, the CPU 11 increases or decreases the high-frequency and low-frequency parameters in accordance with the instructed amount with respect to the instruction image I7. Upon proceeding to the process of S7, the individual response is controlled in accordance with the change in the high-frequency and low-frequency parameters in S15.

In S14, if the link parameter is off (S14; off), the CPU 11 changes the high-frequency parameter independently of the low-frequency parameter in accordance with the user's high-frequency change instruction (S16) and proceeds to the process of S7 In S16, the CPU 11 increases or decreases the high-frequency parameter in accordance with the instructed amount with respect to the instruction image I7. Upon proceeding to the process of S7, the individual response is controlled in accordance with the change in the high-frequency parameter in S16.

In S3, if a change in the link parameter is indicated from the instruction image I8 (S3; link), the CPU 11 changes the link parameter in accordance with the user instruction (S17) and returns to the process of S3. In S3, if a prescribed end instruction is received (S3; end), the current process is ended. The end instruction can be any instruction. For example, an end instruction can be issued by selecting a button to close the filter control screen G.

The control device 10 of this embodiment suitably uses the state in which either the high-frequency parameter or the low-frequency parameter is changed independently and the state in which both the high-frequency parameter and the low-frequency parameter are changed in conjunction with each other. Thus, it is possible to obtain the desired frequency response with fewer instructions and to provide the user with the familiar feel of a Biquad filter-based peaking filter. By changing the high-frequency parameter and the low-frequency parameter with a single instruction, the number of instructions required to obtain the desired frequency response can be reduced as compared with the case in which the parameters are changed with separate instructions. Further, if the high-frequency parameter and the low-frequency parameter have the same value, the user experience (sound quality and operability) is similar to that of changing the Q value of a Biquad filter-based peaking filter. The peaking filter of the present disclosure is characterized in that it provides an asymmetrically shaped amplitude characteristic as well as the same operability and amplitude characteristic (sound quality) of a conventional Biquad filter.

Further, the control device 10 can enhance user convenience by suitably using the state in which only the high-frequency parameter is changed, the state in which only the low-frequency parameter is changed, and the state in which both the high-frequency and low-frequency parameters are increased or decreased.

Further, the control device 10 can enhance user operability by making changes so as to maintain the difference between the high-frequency and low-frequency parameters or the ratio of the high-frequency parameter to the low-frequency parameter.

Further, when, in accordance with the second change instruction, the high-frequency parameter is increased and the low-frequency parameter is decreased or the high-frequency parameter is decreased and the low-frequency parameter is increased, an operation to increase one of the high-frequency parameter and the low-frequency parameter and to decrease the other can be carried out with a single touch.

Further, the control device 10 can enhance user convenience by switching between the first mode and the second mode in accordance with a switching instruction.

Further, regardless of whether the high-frequency change instruction or the low-frequency change instruction is received in the second mode, the control device 10 can change both the high-frequency and low-frequency parameters, thereby obviating the need to prepare a dedicated instruction for the second mode and reducing the number of types of instructions.

Further, since the high-frequency and low-frequency parameters exhibit the same behavior as the Q value of the Biquad filter with respect to the amplitude characteristic of the filter, the user experience (sound quality and operability) is similar to that of changing the Q value of a Biquad filter.

4. Modification

The present disclosure is not limited to the embodiment described above. The present disclosure can be appropriately changed to the extent of not deviating from the essence of the present disclosure.

Figure 9:
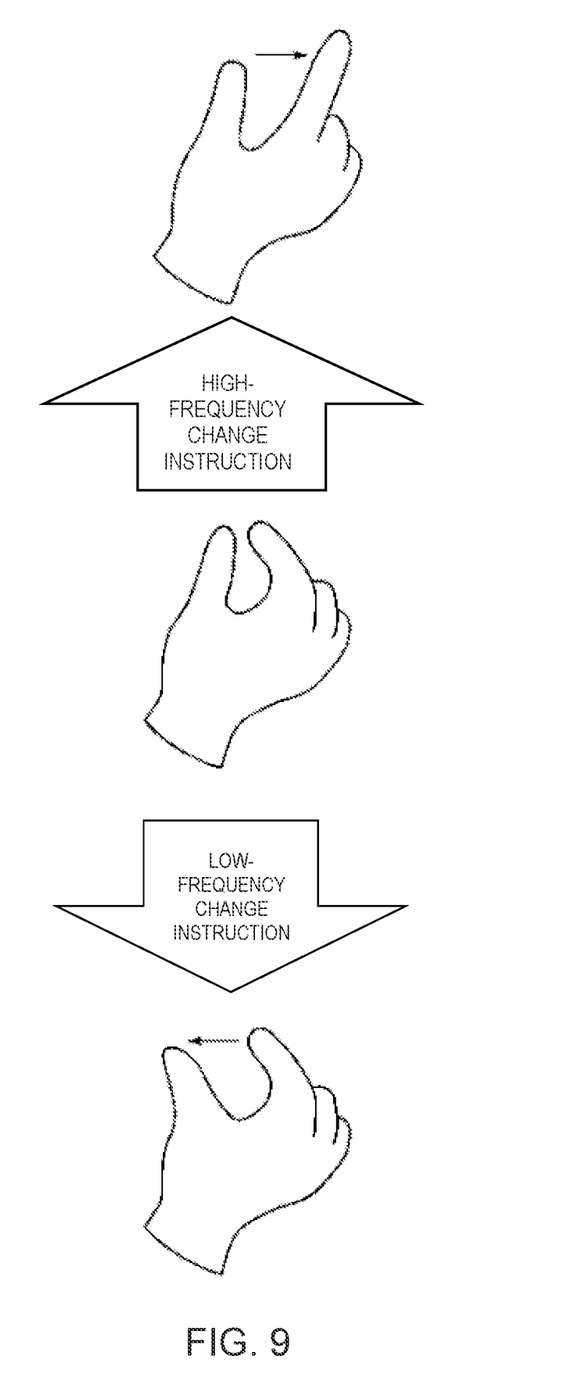
FIG. 9 is a diagram showing an example of a high-frequency change instruction and a low-frequency change instruction of Modified Example (1).

(1) For example, the high-frequency and low-frequency change instructions are not limited to the examples described in the embodiment. FIG. 9 is a diagram showing an example of a high-frequency change instruction and a low-frequency change instruction in Modified Example (1).

In this example, the receiving unit 103 receives the designations of two positions by a pointing device. The pointing device is an input device for indicating position on a plane or in space. For example, the pointing device is a user operable input such as a touch panel, a touch pad, a remote control, or a mouse.

In this variant, a touch panel is used as an example. The case in which the user uses his or her own finger will be described, but an object such as a stylus can be used as well. The user touches at least two positions. The touch panel detects the coordinates of the touched positions. The touch panel can detect three or more positions.

As shown in FIG. 9, a high-frequency change instruction is issued by maintaining the left-side position (relative position on the left side) out of the two positions and moving the right-side position (relative position on the right side). Not changing the position at all or changing the position less than a threshold value corresponds to maintaining the position. It is assumed that the threshold value is stored in the data storage unit 100. The threshold value can be variable. Changing the position more than or equal to the threshold value corresponds to moving the position.

The high-frequency change instruction is a spread operation or a pinch operation in which only the right side is moved. In the case of a spread operation, the distance between the right-side position and the left-side position increases. In the case of a pinch operation, the distance between the right-side position and the left-side position decreases. The left-side position is not necessarily stationary, but can move to a certain extent. For example, if the high-frequency change instruction is a spread operation, an increase is instructed. In this case, in the first mode, only the high-frequency parameter increases, and in the second mode, both the high-frequency and low-frequency parameters increase. If the high-frequency change instruction is a pinch operation, a decrease is instructed. In this case, in the first mode, only the high-frequency parameter decreases, and in the second mode, both the high-frequency and low-frequency parameters decrease.

A low-frequency change instruction is issued by maintaining the right-side position and moving the left-side position. The low-frequency change instruction is a spread operation or a pinch operation in which only the left-side position is moved. The right-side position is not necessarily stationary, but can move to a certain extent. For example, if the low-frequency change instruction is a spread operation, an increase is instructed. In this case, in the first mode, only the high-frequency parameter increases, and in the second mode, both the high-frequency low-frequency parameters increase.

When the user is indicating two position, the link parameter can be switched on or off in response to double-tapping the left side or the right side. For example, if the link parameter is double-tapped in the on state, the link parameter is turned off and the parameter on the double-tapped side is the parameter to be changed. Only the parameter to be changed can be changed in subsequent operations.

For example, if the low-frequency parameter is the parameter to be changed, double-tapping the left side can turn on the link parameter. In this case, if the right side is double-tapped, the high-frequency parameter becomes the parameter to be changed while the link parameter remains off. For example, if the high-frequency parameter is the parameter to be changed, the link parameter can be turned on when the right side is double-tapped. In this case, if the left side is double-tapped, the low-frequency parameter becomes the parameter to be changed while the link parameter remains off.

By Modified Example (1), the high-frequency change instruction and the low-frequency change instruction become more intuitive operations, thereby enhancing operability.

(2) For example, in the embodiment, a case in which the first change instruction and the second change instruction are the same has been described, but these can be different. The second change instruction of this modified example is a different instruction than the high-frequency change instruction and the low-frequency change instruction. For example, on filter control screen G, the display control unit 102 displays a different instruction image than instruction images I6, I7. The different instruction image is for the second change instruction. The receiving unit 103 receives an instruction with respect to this different instruction image to receive the second change instruction. In this case, since it can be understood that a link should be established by the second change instruction, the switching instruction and the link parameter can be omitted. The process of the second changing unit 106 when the second change instruction is received is the same as that of the embodiment.

By Modified Example (2), the second change instruction can be configured to be a different instruction than the high-frequency change instruction and the low-frequency change instruction, so that the switching instruction and the link parameter can be omitted. The link parameter can be omitted in order to reduce the amount of data of related data D.

Figure 10:
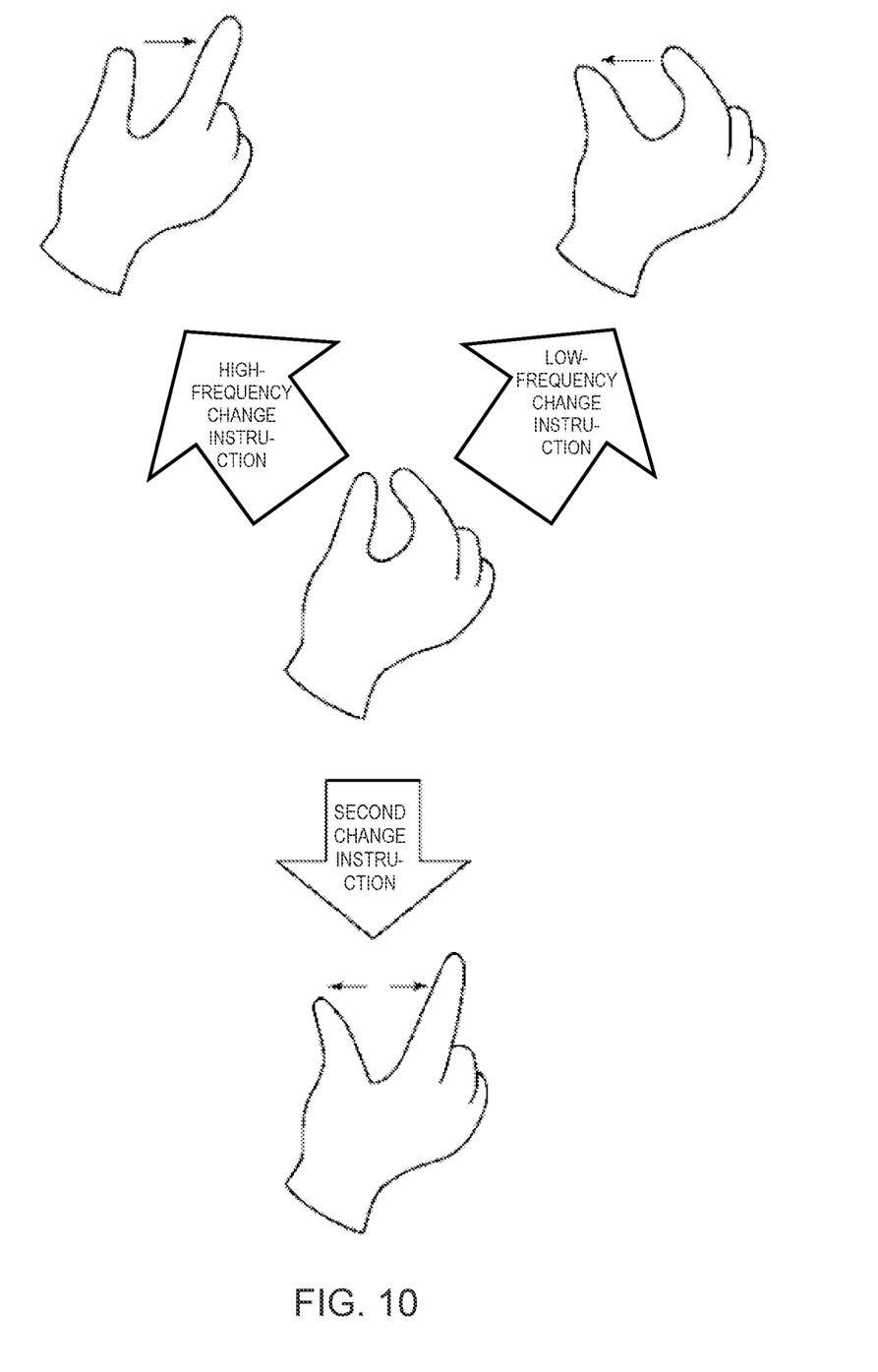
FIG. 10 is a diagram showing an example of a second change instruction of Modified Example (3).

(3) Modified Examples (1) and (2) can be combined, for example, to realize the second change instruction by a different instruction than the instruction shown in FIG. 9. FIG. 10 is a diagram showing an example of a second change instruction of Modified Example (3). The high-frequency and low-frequency change instructions which are first change instruction are as described in Modified Example (1). The second change instruction of this modified example is issued by moving both the left-side position and the right-side position such that the distance between the two changes. A change in distance means that the distance is decreased or increased.

The second change instruction is a spread operation or a pinch operation in which both the right-side position and the left-side position are moved. An operation for moving the right-side position and the left-side position while maintaining the distance therebetween does not correspond to a second change instruction. For example, if the second change instruction is a spread operation, an increase is instructed. In this case, both the high-frequency and low-frequency parameters increase. If the second change instruction is a pinch operation, a decrease is instructed. In this case, both the high-frequency and low-frequency parameters decrease.

By Modified Example (3), the high-frequency change instruction, the low-frequency change instruction, and the second change instruction become more intuitive operations. Further, the switching instruction and the link parameter can be omitted in the same manner as in Modified Example (2).

(4) For example, the case in which the second changing unit 106 changes the high-frequency and low-frequency parameters such that the difference between the high-frequency and low-frequency parameters or the ratio of the high-frequency parameter to the low-frequency parameter is maintained has been described, but it is not particularly necessary that this difference or ratio be maintained. For example, in the second change instruction of Modified Example (3), the low-frequency parameter can be change in accordance with the amount of movement of the left-side position, and the high-frequency parameter can be changed in accordance with the amount of movement of the right-side position.

For example, when the link parameter is on, the high-frequency parameter and the low-frequency parameter can have the same value. In this case, the high-frequency parameter takes on the same value as the low-frequency parameter, or the low-frequency parameter takes on the same value as the high-frequency parameter.

By the control method, control device, and the storage medium of the present disclosure, it is possible to provide a peaking filter that can realize an amplitude characteristic with an asymmetric shape while maintaining the same operability and the same amplitude characteristic as a conventional Biquad filter.

What is claimed is:

1. A control method for controlling a frequency response having a bell-shaped amplitude characteristic of a filter that is configured to process an audio signal, the method comprising:

preparing a high-frequency parameter related to a high-frequency side characteristic on a high-frequency side of the frequency response, and a low-frequency parameter related to a low-frequency side characteristic on a low-frequency side of the frequency response;

independently changing the high-frequency parameter or the low-frequency parameter in accordance with a first change instruction;

changing both of the high-frequency parameter and the low-frequency parameter in conjunction with each other in accordance with a second change instruction;

controlling a slope on the high-frequency side and a slope on the low-frequency side of the bell-shaped amplitude characteristic of the frequency response, by using the high-frequency parameter and the low-frequency parameter;

switching a first mode for receiving the first change instruction and a second mode for receiving the second change instruction in accordance with a switching instruction; and receiving a high-frequency change instruction or a low-frequency change instruction, in the first mode or the second mode, in response to receiving the high-frequency change instruction or the low-frequency change instruction in the first mode, the high-frequency parameter being changed in accordance with the high-frequency change instruction, and the low-frequency parameter being changed in accordance with the low-frequency change instruction, and in response to receiving the high-frequency change instruction or the low-frequency change instruction in the second mode, both the high-frequency parameter and the low-frequency parameter being changed irrespective of whether the high-frequency change instruction or the low-frequency change instruction is received.

2. The control method according to claim 1, wherein the high-frequency parameter is a Q value that indicates a sharpness on the high-frequency side of the bell-shaped amplitude characteristic, and the low-frequency parameter is a Q value that indicates a sharpness on the low-frequency side of the bell-shaped amplitude characteristic.

3. The control method according to claim 1, wherein
in response to a change in the high-frequency parameter being indicated by the first change instruction, the low-frequency parameter is not changed, and the high-frequency parameter is changed, and
in response to a change in the low-frequency parameter being indicated by the first change instruction, the high-frequency parameter is not changed, and the low-frequency parameter is changed.

4. The control method according to claim 1, wherein
in response to an increase in the high-frequency parameter or the low-frequency parameter being indicated by the second change instruction, both of the high-frequency parameter and the low-frequency parameter are increased, and
in response to a decrease in the high-frequency parameter or the low-frequency parameter being indicated by the second change instruction, both of the high-frequency parameter and the low-frequency parameter are decreased.

5. The control method according to claim 1, wherein
both of the high-frequency parameter and the low-frequency parameter are changed in accordance with the second change instruction such that a difference between the high-frequency parameter and the low-frequency parameter or a ratio of the high-frequency parameter to the low-frequency parameter is maintained.

6. The control method according to claim 1, wherein
in accordance with the second change instruction,
the high-frequency parameter is increased, and the low-frequency parameter is decreased, or
the high-frequency parameter is decreased, and the low-frequency parameter is increased.

7. The control method according to claim 1, further comprising
setting a plurality of coefficients of the filter based on the frequency response for which the controlling of the slopes has been performed, to obtain the filter having the frequency response.

8. The control method according to claim 1, wherein
the receiving of the high-frequency change instruction or the low-frequency change instruction is performed by receiving designation of two positions by a pointing device,
the high-frequency change instruction is issued by maintaining a left-side position of the two positions and moving a right-side position of the two positions, and
the low-frequency change instruction is issued by maintaining the right-side position and moving the left-side position.

9. The control method according to claim 1, wherein
the high-frequency parameter and the low-frequency parameter exhibit the same behavior, with respect to the amplitude characteristic of the filter, as a behavior in a slope of a curve of the amplitude characteristic due to a change of a Q value of a Biquad filter.

10. A control device for controlling a frequency response having a bell-shaped amplitude characteristic of a filter that is configured to process an audio signal, the control device comprising:
one or more processors; and
one or more computer-readable devices that store at least one program that is executed by the one or more processors,
the one or more processors being configured to, by executing the at least one program,
prepare a high-frequency parameter related to a high-frequency side characteristic on a high-frequency side of the frequency response and a low-frequency parameter related to a low-frequency side characteristic on a low-frequency side of the frequency response,
independently change the high-frequency parameter or the low-frequency parameter in accordance with a first change instruction,
change both of the high-frequency parameter and the low-frequency parameter in conjunction with each other in accordance with a second change instruction,
control a slope on the high-frequency side and a slope on the low-frequency side of the bell-shaped amplitude characteristic of the frequency response, by using the high-frequency parameter and the low-frequency parameter,
switch a first mode for receiving the first change instruction and a second mode for receiving the second change instruction in accordance with a switching instruction, and
receive a high-frequency change instruction or a low-frequency change instruction, in the first mode or the second mode,
in response to receiving the high-frequency change instruction or the low-frequency change instruction in the first mode, the one or more processors being configured to change the high-frequency parameter in accordance with the high-frequency change instruction, and change the low-frequency parameter in accordance with the low-frequency change instruction, and
in response to receiving the high-frequency change instruction or the low-frequency change instruction in the second mode, the one or more processors being configured to change both the high-frequency parameter and the low-frequency parameter irrespective of whether the high-frequency change instruction or the low-frequency change instruction is received.

11. A non-transitory computer-readable medium storing a program that causes a computer, which controls a frequency response having a bell-shaped amplitude characteristic of a filter that is configured to process an audio signal, to execute a process, the process comprising:
preparing a high-frequency parameter related to a high-frequency side characteristic on a high-frequency side of the frequency response and a low-frequency parameter related to a low-frequency side characteristic on a low-frequency side of the frequency response;
changing independently the high-frequency parameter or the low-frequency parameter in accordance with a first change instruction;
changing both of the high-frequency parameter and the low-frequency parameter in conjunction with each other in accordance with a second change instruction;
controlling a slope on the high-frequency side and a slope on the low-frequency side of the bell-shaped amplitude characteristic of the frequency response, by using the high-frequency parameter and the low-frequency parameter;
switching a first mode for receiving the first change instruction and a second mode for receiving the second change instruction in accordance with a switching instruction, and
receiving a high-frequency change instruction or a low-frequency change instruction, in the first mode or the second mode,
in response to receiving the high-frequency change instruction or the low-frequency change instruction in the first mode, the high-frequency parameter being changed in accordance with the high-frequency change instruction, and the low-frequency parameter being changed in accordance with the low-frequency change instruction, and in response to receiving the high-frequency change instruction or the low-frequency change instruction in the second mode, both the high-frequency parameter and the low-frequency parameter being changed irrespective of whether the high-frequency change instruction or the low-frequency change instruction is received.

\* \* \* \* \*